US008432218B1

United States Patent
Rudell et al.

(10) Patent No.: US 8,432,218 B1
(45) Date of Patent: Apr. 30, 2013

(54) HARMONIC-REJECTION POWER AMPLIFIER

(75) Inventors: Jacques C. Rudell, Seattle, WA (US); Parmoon Seddighrad, Portland, OR (US); David J. Allstot, Seattle, WA (US)

(73) Assignee: University of Washington through its Center For Commercialization, Seattle, WA (US)

( * ) Notice: Subject to any disclaimer, the term of this patent is extended or adjusted under 35 U.S.C. 154(b) by 0 days.

(21) Appl. No.: 13/086,361

(22) Filed: Apr. 13, 2011

Related U.S. Application Data

(60) Provisional application No. 61/323,469, filed on Apr. 13, 2010.

(51) Int. Cl.
*H03F 3/68* (2006.01)

(52) U.S. Cl.
USPC .................. 330/124 R; 330/295; 330/286

(58) Field of Classification Search .................. 330/295, 330/124 R, 84, 53–54, 286
See application file for complete search history.

(56) References Cited

U.S. PATENT DOCUMENTS

| | | | | |
|---|---|---|---|---|
| 6,996,379 B2 * | 2/2006 | Khorram | .......................... | 455/91 |
| 2006/0160518 A1 * | 7/2006 | Seendripu et al. | ............ | 455/323 |

OTHER PUBLICATIONS

Weldon et al., "A 1.75-GHz Highly Integrated Narrow-Band CMOS Transmitter With Harmonic-Rejection Mixers," IEEE Journal of Silod-State Circuits, vol. 36, No. 12, Dec. 2001, pp. 2003-2015.
Thompson et al., "Distributed Power Amplifier with Electronic Harmonic Filtering," 2009 IEEE Radio Frequency Integrated Circuits Symposium, Jun. 2009.
Uchida et al., "A Reflection-Absorptive Harmonic-Rejection Filter for RF Power Amplifiers," Proceedings of the 40th European Microwave Conference, Sep. 2010.
4. P. Haldi, D. Chowdhury, G. Liu, and A. Niknejad, "A 5.8GHz Linear Power Amplifier in a Standard 90nm CMOS", IEEE Proc. of the Journal of Solid-State Circuits, May. 2008.

* cited by examiner

*Primary Examiner* — Hieu Nguyen
(74) *Attorney, Agent, or Firm* — McDonnell Boehnen, Hulbert & Berghoff LLP

(57) ABSTRACT

A harmonic-rejection power amplifier is disclosed. In an embodiment, the harmonic-rejection power amplifier includes a plurality of stages, each stage comprising a respective signal-generation component coupled to a respective power amplifier, wherein the respective signal-generation component is configured to output a respective signal having a respective phase, and wherein the respective power amplifier is configured to output an amplified version of the respective signal. In the harmonic-rejection power amplifier, each respective phase differs from each other respective phase by a respective amount that is predefined based on a number of stages in the plurality of stages, and the plurality of stages are coupled in parallel to a combiner configured to combine the output of each respective power amplifier into a combined output. At least one harmonic in the combined output may be at least partially rejected.

20 Claims, 4 Drawing Sheets

HARMONIC-REJECTION POWER AMPLIFIER

CROSS-REFERENCE TO RELATED APPLICATIONS

This application claims priority to U.S. Provisional Patent Application Ser. No. 61/323,469 filed on Apr. 13, 2010, which is hereby incorporated by reference in its entirety.

BACKGROUND

In recent years, there has been rapid development in the field of consumer electronics for wireless communication. This development has been fueled in part by lower-cost, higher performance wireless transceivers for use in consumer electronics. Many improvements in wireless transceivers have become available as a result of advances in complementary metal-oxide-semiconductor (CMOS) technologies. In particular, many signal-generation components of wireless transceivers may now be integrated in CMOS, reducing the cost of wireless transceivers and, in turn, consumer electronics.

However, some components of wireless transceivers have not been amenable to integration in CMOS. One such component is a power amplifier, which has proven difficult to implement in CMOS as a result of inherent limitations of CMOS transistors as well as the inherent limitations of the power amplifier themselves. As one example, current power amplifiers produce harmonics (e.g., frequency components at integer multiples of the output frequency) that may need to be removed using one or more discrete filters that cannot be integrated in CMOS. Thus, even if integration of current power amplifiers in CMOS became feasible, the discrete filters required to remove the harmonics produced by such power amplifiers would remain an issue for complete integration. Accordingly, an improved power amplifier that can more easily be integrated in CMOS is desired.

SUMMARY

Disclosed herein is such an improved power amplifier, referred to hereinafter as a harmonic-rejection power amplifier (HRPA), which reduces the need for discrete (non-integrated) filters and thus can more easily be integrated in CMOS.

The disclosed HRPA employs a harmonic-rejection scheme in which signals with differing phases are supplied to power amplifiers and are combined in parallel to produce a combined output. The differing phases are selected so as to at least partially reject one or more harmonics produced in the combined output of the power amplifiers. As a result, the disclosed HRPA may reduce the need for discrete filters. In addition to reducing the need for discrete filters, the HRPA may exhibit improved linearity as compared with typical CMOS-integrated power amplifiers. As another advantage, the HRPA may exhibit reduced power consumption by avoiding the amplification and output of unwanted harmonics. Other advantages are possible as well.

One embodiment of the disclosed HRPA may take the form of a first HRPA that includes a plurality of stages that each comprise a respective signal-generation component coupled to a respective power amplifier, where (a) the respective signal-generation component is configured to output a respective signal having a respective phase, (b) the respective power amplifier is configured to output an amplified version of the respective signal, (c) each respective phase differs from another respective phase by a respective amount that is predefined based on a number of stages in the plurality of stages, and (d) the plurality of stages are coupled in parallel to a combiner configured to combine the output of each respective power amplifier into a combined output. Preferably, within this configuration, at least one harmonic in the combined output will be at least partially rejected (e.g., due to deconstructive interference of the outputs of the respective power amplifiers).

The respective signal-generation components of the first HRPA may take various forms. In one example, the respective signal-generation component may take the form of a mixer configured to output the respective signal by mixing a respective baseband signal with a respective transmit signal having the respective phase. In this respect, the respective baseband signals may take many forms. In some instances, each of the respective baseband signals may be substantially similar. In other instances, each of the respective baseband signals may be generated by the same entity. In still other instances, each of the baseband signals may be a pair of signals, with one signal being an in-phase signal and the second signal being a quadrature signal. The respective baseband signals may take other forms as well. The respective transmit signals may also take many forms. In some instances, each of the respective transmit signals may be a square wave signal. In this respect, each of the respective transmit signals may either be generated at a respective local oscillator, or at the same local oscillator. The respective transmit signals may take other forms as well.

The combiner of the first HPRA may take various forms as well. In one example, the combiner may include a plurality of transformers. In another example, the combiner may be configured to weight at least one output by a predefined factor before combining the output of each respective power amplifier into the combined output. In this respect, the predefined factor may be predefined based on the number of stages.

Another embodiment of the disclosed HRPA may take the form of a second HRPA that includes (1) a first stage comprising a first signal-generation component coupled to a first power amplifier, where the first signal-generation component is configured to output a first signal having a first phase and the first power amplifier is configured to output an amplified version of the first (2) a second stage comprising a second signal-generation component coupled to a second power amplifier, where the second signal-generation component is configured to output a second signal having a second phase and the second power amplifier is configured to output an amplified version of the second signal, and (3) a third stage comprising a third signal-generation component coupled to a third power amplifier, where the third signal-generation component is configured to output a third signal having a third phase and the third power amplifier is configured to output an amplified version of the third signal. In this second HRPA, the first phase differs from the second phase by an amount of 90° and differs from the third phase by an amount of 180°, and the first stage, the second stage, and the third stage are coupled in parallel to a combiner configured to combine the outputs of the first, second, and third power amplifiers into a combined output (e.g., a quantized sine wave). Preferably, within this configuration, at least one harmonic in the combined output will be at least partially rejected (e.g., due to deconstructive interference of the outputs of the first, second, and third power amplifiers).

The first, second, and third signal-generation components of the second HRPA may take various forms. In one example, each signal-generation component may take the form of a mixer configured to output a respective signal by mixing a respective baseband signal with a respective transmit signal having the respective phase. In this respect, the respective baseband signals may take many forms. In some instances, each of the respective baseband signals may be substantially similar. In other instances, each of the respective baseband signals may be received from the same entity. In still other instances, each of the baseband signals may be a pair of signals, with one signal being an in-phase signal and the other signal being a quadrature signal. The respective baseband signals may take other forms as well. The respective transmit signals may also take many forms. In some instances, each of the respective transmit signals may be a square wave signal. In this respect, each of the respective transmit signals may either be generated at a respective local oscillator, or at the same local oscillator. The respective transmit signals may take other forms as well.

The combiner of the second HPRA may take various forms as well. In one example, the combiner may include a plurality of transformers. In another example, the combiner may be configured to weight at least one output by a predefined factor before combining the output of each respective power amplifier into the combined output. In this respect, the predefined factor may be predefined based on the number of stages.

The combined output may take various forms as well. In one example, the combined output may be a quantized sine wave. The combined output may take other forms as well.

Also disclosed is a method that includes (a) generating a plurality of outputs, wherein each respective output comprises an amplified version of a respective signal (e.g., a square wave) having a respective phase, and wherein each respective phase differs from each other respective phase by a respective amount that is predefined based on a number of stages in the plurality of stages, and (b) combining the plurality of outputs into a combined output. Preferably, by carrying out this method, at least one harmonic in the combined output will be at least partially rejected (e.g., due to deconstructive interference of the plurality of outputs).

These as well as other aspects and advantages will become apparent to those of ordinary skill in the art by reading the following detailed description, with reference where appropriate to the accompanying drawings.

BRIEF DESCRIPTION OF THE FIGURES

FIGS. 2a-e illustrate harmonic rejection in a harmonic-rejection power amplifier.

DETAILED DESCRIPTION

Disclosed herein is a harmonic-rejection power amplifier (HRPA) in which power amplifiers are connected in parallel and supplied with signals having phases that are predefined so as to at least partially reject one or more harmonics produced in a combined output of the power amplifiers. Within this configuration, the outputs of the power amplifiers may be superimposed to cause deconstructive interference at harmonic frequencies (e.g., integer multiples of the output frequencies of the power amplifiers, such as $3^{rd}$-order and $5^{th}$-order harmonics), thereby reducing the amplitude of the harmonics.

1. EXAMPLE ARCHITECTURE

According to an embodiment, the disclosed HRPA may include a plurality of stages that each comprise a respective signal-generation component coupled to a respective power amplifier. The term "stage" is used herein to describe a set of circuit components that are combined to form a circuit that may be combined in parallel with other circuits. Another term for the stages could be "power amplifier driver stages." For the sake of simplicity, the term "stage" is used throughout.

In each such stage, the respective signal-generation component is configured to output a respective signal having a respective phase, and the respective power amplifier is configured to output an amplified version of the respective signal. In the disclosed HRPA, each respective phase differs from each other respective phase by a respective amount that is predefined based on a number of stages in the plurality of stages. The plurality of stages are then coupled parallel to a combiner configured to combine the output of each respective power amplifier into a combined output. Upon combining, at least one harmonic of the combined output may be at least partially rejected.

For purposes of illustration, an HRPA embodiment 10 that includes three stages will now be described with reference to FIG. 1. It is to be understood, however, that any number of parallel stages could be used to produce outputs that may be combined to produce a combined output in which at least one harmonic is at least partially rejected.

Figure 1:
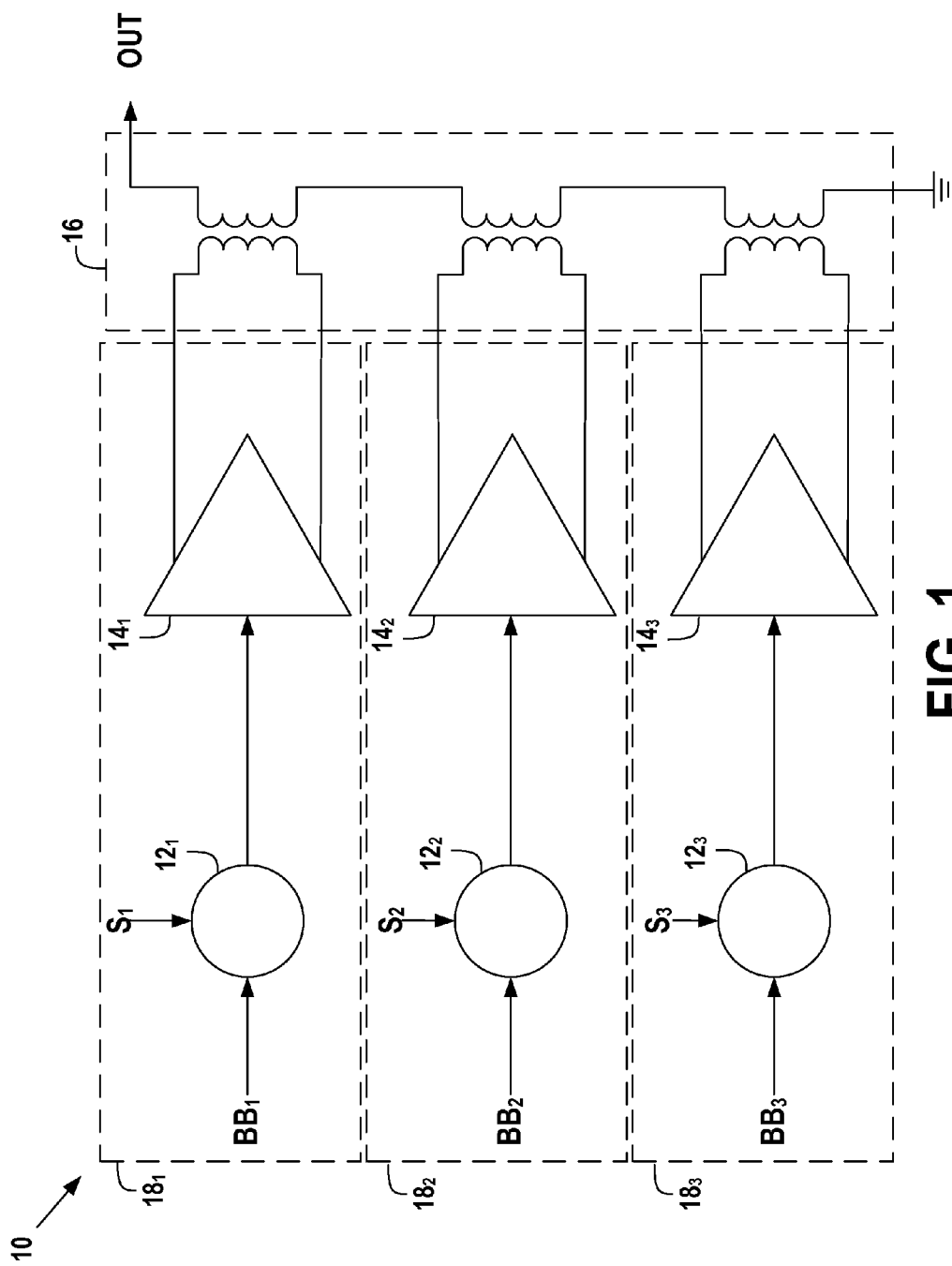
FIG. 1 depicts a harmonic-rejection power amplifier, in accordance with an embodiment.

As shown in FIG. 1, HRPA 10 includes three stages 18, each having a signal-generation component 12 coupled to a power amplifier 14. For instance, the first stage $18_1$ may include a first signal-generation component $12_1$ coupled to a first power amplifier $14_1$, the second stage $18_2$ may include a second signal-generation component $12_2$ coupled to a second power amplifier $14_2$, and the third stage $18_3$ may include a third signal-generation component $12_3$ coupled to a third power amplifier $14_3$. The first stage $18_1$, the second stage $18_2$, and the third stage $18_3$ may then be coupled in parallel to a combiner 16.

Each of the signal-generation components 12 may be any signal-generation component configured to output a signal having a desired phase. For example, each of the signal-generation components 12 may be a mixer configured to output a signal having a desired phase by mixing a baseband signal BB with a transmit signal S. To this end, each signal-generation component 12 may include or may be coupled to a respective local oscillator configured to generate a transmit signal S. In one example, each of the respective local oscillators may be offset from the other respective local oscillators by a predefined phase that is based on a number of stages 18 in the HRPA, such that the signals output by the signal-generating components 12 and respectively amplified by the power amplifiers 14 may constructively interfere at a fundamental frequency and/or destructively interfere at one or more harmonic frequencies upon being combined at the combiner 16. For instance, the phases of the local oscillators may be shifted from one another by an amount approximately equal to 120°. Accordingly, for the three-stage HRPA shown in FIG. 1, a local oscillator included in or coupled to the first signal-generation component $12_1$ may have a phase of 0°, a local oscillator included in or coupled to the second signal-generation component $12_2$ may have a phase of 120°, and a local oscillator included in or coupled to the third signal-generation component $12_3$ may have a phase of 240°. Other examples are possible as well.

The baseband signals BB may take various forms. In one example, each baseband signal BB may be a low frequency (e.g., non-RF) signal. In another example, the baseband signals BB may be output via multiple outputs of a single entity. In yet another example, the baseband signals BE may be supplied by multiple entities. In still another example, the baseband signals BB may be substantially similar to one another, or may be different. Other examples are possible as well.

The transmit signals S may also take various forms. In one example, each transmit signal S may be a square wave. In another example, each transmit signal S may be generated by a local oscillator, as described above. In yet another example, each transmit signal S may be generated by a frequency synthesizer coupled to a divider circuit, such as a divide-by-four circuit. In still another example, each transmit signal S may be generated by a quadrature generation circuit. Other examples are possible as well.

As noted above, each of the signal-generation components 12 may be a mixer configured to output a signal having a desired phase by mixing a baseband signal BB with a transmit signal S. For instance, the first signal-generation component $12_1$ may be configured to mix or otherwise combine the first baseband signal $BB_1$ and the first transmit signal $S_1$ to produce a first signal having a first phase. Similarly, the second signal-generation component $12_2$ may be configured to mix or otherwise combine the first baseband signal $BB_2$ with the second transmit signal $S_2$ to produce a second signal having a second phase. Similarly yet, the third signal-generation component $12_3$ may be configured to mix or otherwise combine the third baseband signal $BB_3$ and the third transmit signal $S_3$ to produce a third signal having a third phase.

The desired phases may take various forms. For example, each of the desired phases may be the same as the phase of a respective transmit signal S. For instance, the first phase may be the same as a phase of the first transmit signal $S_1$, the second phase may be the same as a phase of the second transmit signal $S_2$, and the third phase may be the same as a phase of the third transmit signal $S_3$. As another example, each of the desired phases may be predefined based on a number of stages 18 in the HRPA. For instance, in the three-stage HRPA the phases may be offset from one another by, for example, 90° or 45°. In an HRPA with more than three stages, the phases may be offset from one another by a smaller offset. Other examples are possible as well.

Each power amplifier 14 may be any power amplifier configured to receive a respective signal from a respective signal-generation component 12 and amplify the respective signal. In particular, the first power amplifier $14_1$ may be configured to receive the first signal (having the first phase) produced by the first signal-generation component $12_1$ and to amplify the first signal to produce an amplified version of the first signal. Similarly, the second power amplifier $14_2$ may be configured to receive the second signal (having the second phase) produced by the second component $12_2$ and to amplify the second signal to produce an amplified version of the second signal. Similarly yet, the third power amplifier $14_3$ may be configured to receive the third signal (having the third phase) produced by the third signal-generation component $12_3$ and to amplify the third signal to produce an amplified version of the third signal.

Combiner 16 may be any combiner configured to combine the outputs of the power amplifiers 14. As such, combiner 16 may take various forms. In one example, as shown, combiner 16 may include three transformers in series, each of which is configured to receive the output of a respective power amplifier 14. In another example, the combiner 16 may include the same number of transformers as the number of stages 18 in the HRPA. Other examples are possible as well.

Combiner 16 may combine the outputs of the power amplifiers 14 using various techniques. In one example, the combiner 16 may sum the outputs. In another example, before combining, the combiner 16 may be configured to weight or scale one or more of the outputs by a predefined factor. For instance, before combining, the combiner 16 may weight one or more of the outputs by a factor of $\sqrt{2}$. Other predefined factors may be used as well, including predefined factors that depend on a number of stages 18 in the HRPA and/or the first, second, and third phases. In one example, in order to weight one or more of the outputs, the combiner 16 may modify a turn-ratio of one or more transformers in the combiner 16 such that the turn-ratio for the one or more transformers differs from a turn-ratio for one or more other transformers in the combiner 16. For a given transformer, the turn-ratio may be given by, for example, $N_p/N_s$, where $N_p$, is the number of turns on a primary coil of the transformer and $N_s$ is the number of turns on a secondary coil of the transformer. Other examples are possible as well.

Upon combining the output of the first power amplifier $14_1$ (which is an amplified version of the first signal having the first phase), the output of the second power amplifier $14_2$ (which is an amplified version of the second signal having the second phase), and the output of the third power amplifier $14_3$ (which is an amplified version of the third signal having the third phase), such outputs may destructively interfere with one another due to the differences between the first, second, and third phases. In particular, the first, second, and third output signals may destructively interfere at the frequencies of the $3^{rd}$-order and $5^{th}$-order harmonics, thereby reducing the amplitude of the $3^{rd}$-order and $5^{th}$-order harmonics. This reduction in the amplitudes of the harmonics may be referred to as harmonic rejection. The harmonic rejection of the HRPA is further described with reference to FIGS. 2a-c.

Figure 2B:
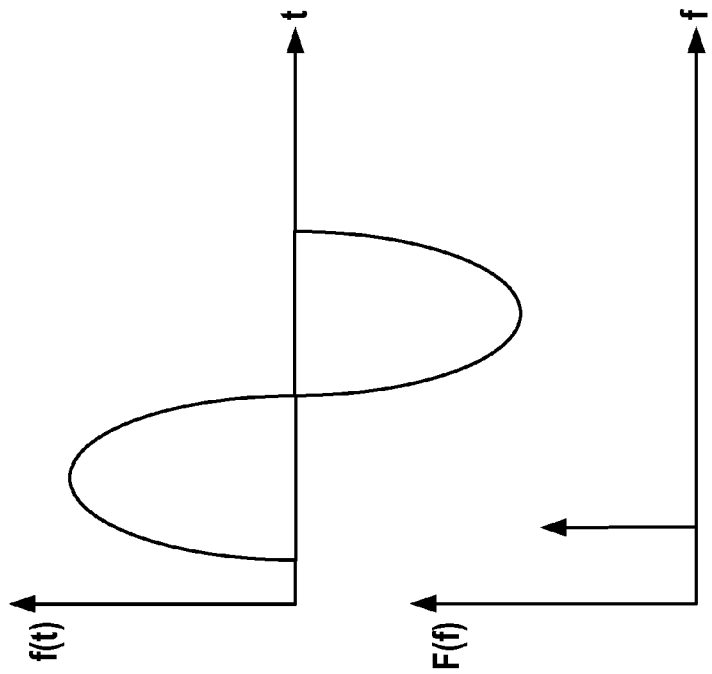
Figure 2A:
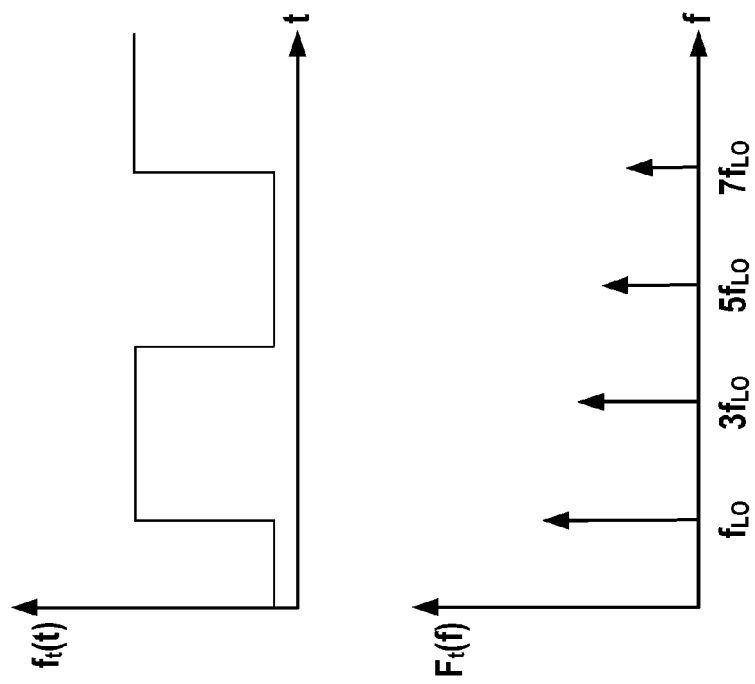

Typical power amplifiers output a single square wave. However, the square wave may contribute to the harmonics produced in the output of the typical power amplifier. To explain this contribution, time and frequency domain plots of a square wave are shown in FIG. 2a. As shown, in the frequency domain, the square wave has frequency components at each of the odd-order harmonic frequencies. As a result, when a baseband signal is mixed with a square wave, the resulting signal includes each of the odd-order harmonics, most notably the $3^{rd}$-order and $5^{th}$-order harmonics.

As the square wave produces these $3^{rd}$-order and $5^{th}$-order harmonics, it may be advantageous to consider other wave types for use in a power amplifier. One such wave type is the ideal sine wave. The ideal sine wave is particularly advantageous as it produces no harmonics beyond the fundamental frequency, as shown in FIG. 2b, which depicts time and frequency domain plots of an ideal sine wave. It can be seen that, in the frequency domain, the ideal sine wave has a frequency component only at the fundamental frequency and does not include any harmonics. Thus, a power amplifier that could output an ideal sine wave would allow for rejection of all harmonics.

Figure 2C:
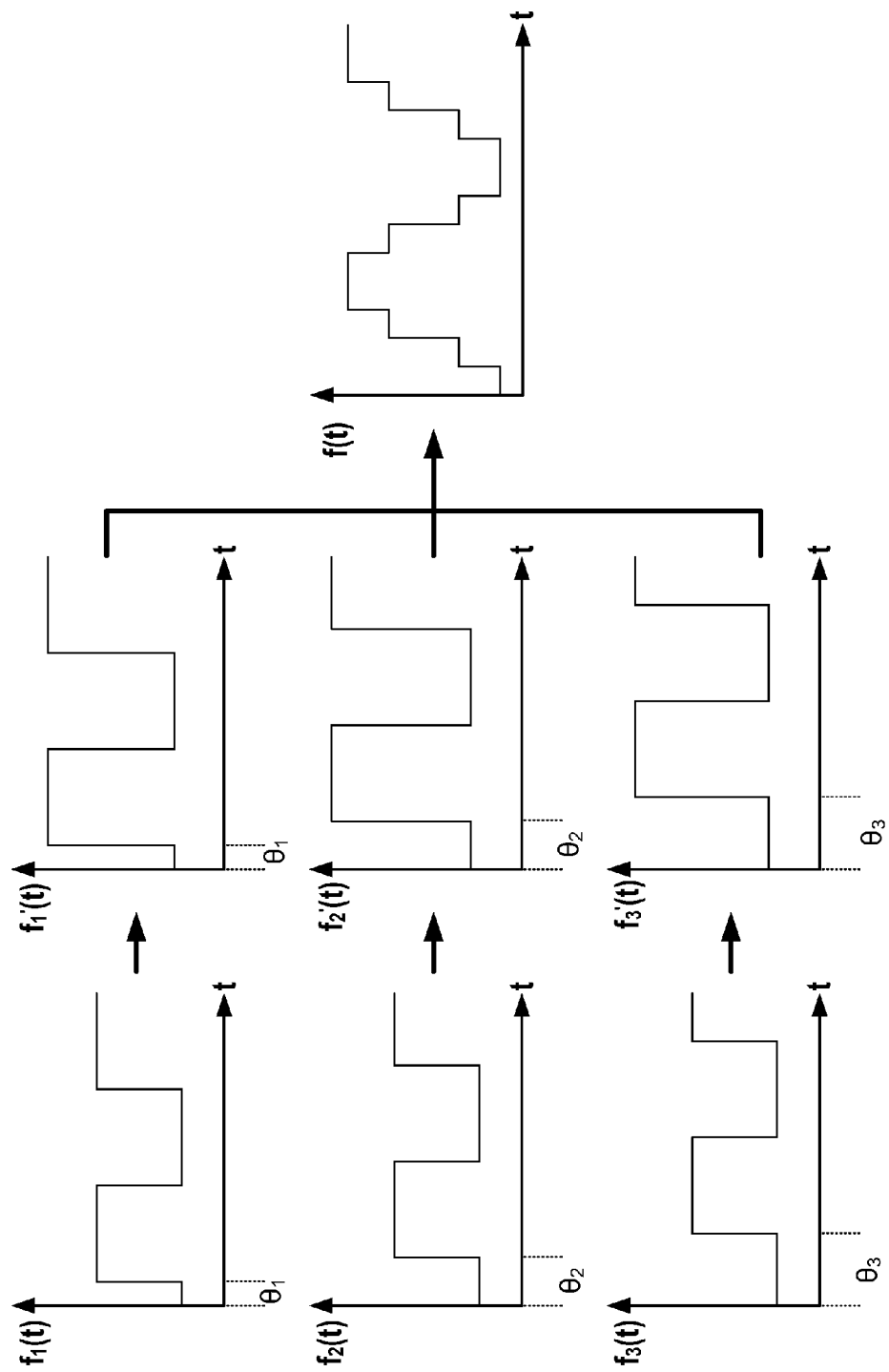

However, production of an ideal sine wave in CMOS is not straightforward. Accordingly, the HRPA may be configured to produce an approximation of the ideal sine wave, namely a quantized sine wave. By approximating the ideal sine wave, the quantized sine wave may enable at least partial rejection of one or more harmonics in an output of the HRPA. For example, the $3^{rd}$-order and $5^{th}$-order harmonics may be at least partially rejected. In an HRPA with more than three stages, additional harmonics, such as $7^{th}$-order and 9th-order harmonics, could be at least partially rejected as well. In general, an HRPA with more stages may at least partially reject a larger number of harmonics. The production of a quantized sine wave is illustrated in FIG. 2c. For purposes of illustration, the production is described for the three-stage HRPA shown in FIG. 1. It is to be understood, however, that the production could be extrapolated for any number of stages.

FIG. 2c shows a first square wave $f_1(t)$, a second square wave $f_2(t)$, and a third square wave $f_3(t)$ that may be output by respective signal-generation components, such as the signal-generation components 12 described above. As shown, the first square wave $f_1(t)$ has a first phase $\theta_1$, the second square wave $f_2(t)$ has a second phase $\theta_2$, and the third square wave $f_3(t)$ has a first phase $\theta_3$. In general, the phases may take any number of values, depending on the number of stages in the HRPA and the desired wave type. For instance, as described above, the phases may be offset from one another by 90°. Accordingly, as shown in FIG. 2c, the first phase may differ from the second phase by an amount of, for example, 90° and from the third phase by an amount of, for example, 180°. It is to be understood, however, that other phases are possible as well.

As described above, each of the first square wave $f_1(t)$, the second square wave $f_2(t)$, and the third square wave $f_3(t)$ may be output to a respective power amplifier, such as the power amplifiers 14 described above. Each respective power amplifier may amplify a respective square wave signal to produce an amplified version of the respective square wave signal, and the amplified version may have the same phase as the respective square wave signal. In particular, as shown, the first square wave $f_1(t)$ may be amplified to produce an amplified version $f_1'(t)$ of the first square wave $f_1(t)$ that has the first phase $\theta_1$. Similarly, the second square wave $f_2(t)$ may be amplified to produce an amplified version $f_2'(t)$ of the second square wave $f_2(t)$ that has the second phase $\theta_2$, and the third square wave $f_3(t)$ may be amplified to produce an amplified version $f_3'(t)$ of the third square wave $f_3(t)$ that has the third phase $\theta_3$.

Further, as described above, the first amplified version $f_1'(t)$, the second amplified version $f_2'(t)$, and the third amplified version $f_3'(t)$ may be combined by a combiner, such as combiner 16, to produce a combined output f(t). As shown, the combined output f(t) is a quantized sine wave. As described above, one or more of the first square wave $f_1(t)$, the second square wave $f_2(t)$, and the third square wave $f_3(t)$ may be weighted or scaled by a predefined factor prior to being combined. This may allow for a better approximation of the ideal sine wave. As shown in FIG. 2c, the combined signal f(t) is given by:

$$f(t) = \sqrt{2} f_2(t) + f_3(t).$$

It is to be understood that the quantized sine wave signal f(t) is merely exemplary, and other combined signals are possible as well, depending on the forms of $f_1(t), f_2(t), f_3(t), f_1'(t), f_2'(t), f_3'(t), \theta_1, \theta_2, \theta_3$, and the number of stages in the HRPA. Many combinations of signals, phases, and predefined factors are possible.

Because the combined signal f(t) is a quantized sine wave, and not an ideal sine wave, the harmonics may not be completely rejected, but may nevertheless be reduced in amplitude. In one example, the $3^{rd}$-order and $5^{th}$-order harmonics may be significantly reduced in amplitude as a result of destructive interference that occurs upon combining of the outputs of the power amplifiers. In this manner, the HRPA may at least partially reject one or more harmonics in the output of the HRPA, reducing the need for discrete filters.

By making use of square waves, the disclosed HRPA lends itself well to an implementation using switched-mode power amplifier topologies, such as Class E, F, & G power amplifiers. However, this technique is not limited to switch-based PA topologies and could be easily applied, as in the described implementation, for more linear PA driver stages such as Class A, AB and C power amplifiers.

2. EXAMPLE OPERATION

Figure 3:
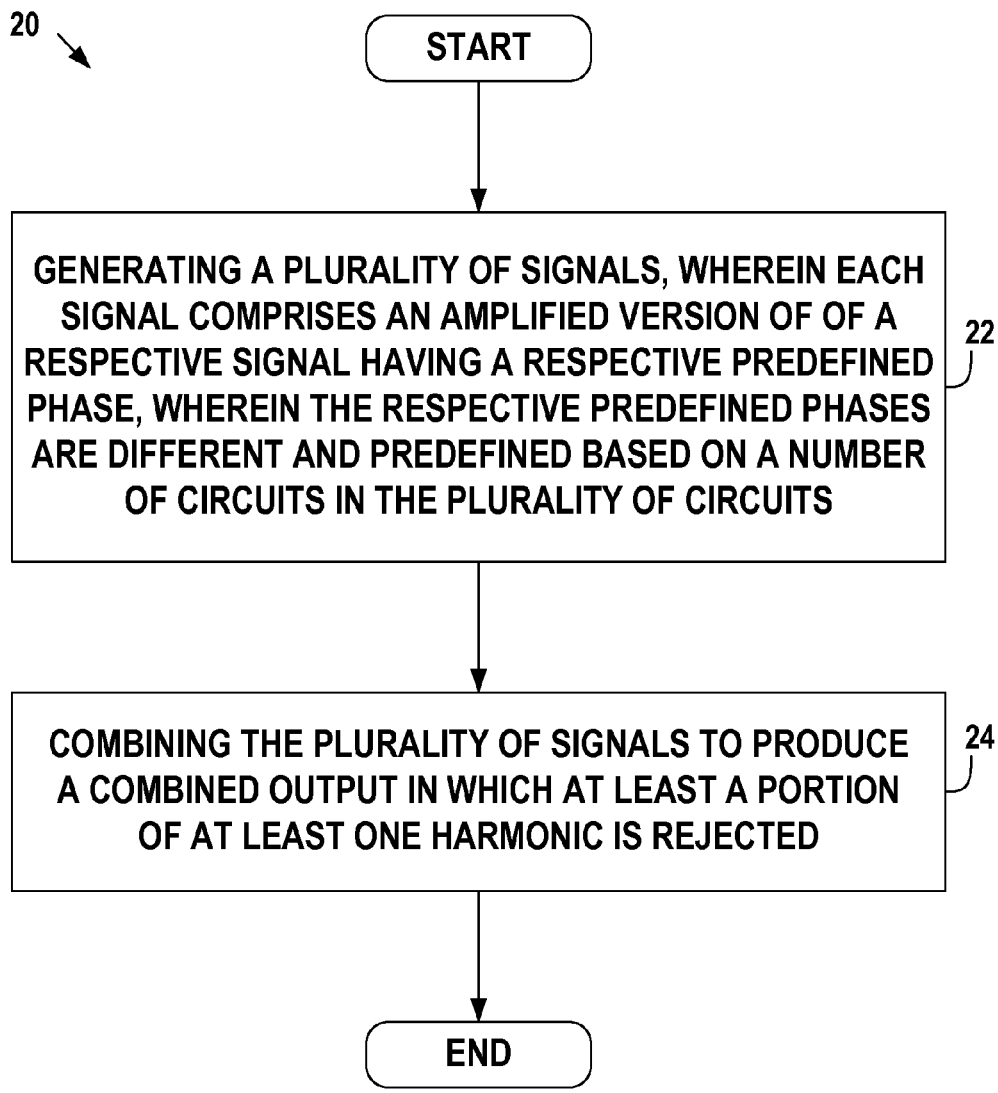
FIG. 3 is a simplified flow chart depicting an example operation of the disclosed harmonic-rejection power amplifier.

FIG. 3 is a simplified flow chart depicting an example operation of the disclosed harmonic-rejection power amplifier. As shown, the example method 20 begins at step 22 with the generation of a plurality of outputs, wherein each output comprises an amplified version of a respective signal having a respective phase, and wherein each respective phase differs from each other respective phase by a respective amount that is predefined based on a number of stages in the plurality of stages. The generation of each respective output may be carried out by a respective stage, such as stage $18_1$, that includes a signal-generation component configured to generate the respective signal having the respective phase and a power amplifier configured to output an amplified version of the respective signal.

As described above, each of the respective phases may be predefined based on a number of stages in the HRPA. For example, each of the desired phases may be the same as the phase of a respective transmit signal S. For instance, the first phase may be the same as a phase of the first transmit signal $S_1$, the second phase may be the same as a phase of the second transmit signal $S_2$, and the third phase may be the same as a phase of the third transmit signal $S_3$. As another example, each of the desired phases may be predefined based on a number of stages in the HRPA. For instance, the respective phases may be offset from one another by 90°. Other phases are possible as well.

At step 24, the plurality of outputs may be combined into a combined output. As described above, this may be performed by a combiner including, for example, a plurality of transformers. Upon combining, the outputs may destructively interfere at the frequencies of the $3^{rd}$-order and $5^{th}$-order harmonics, thereby reducing the amplitude of the $3^{rd}$-order and $5^{th}$-order harmonics. In this manner, the $3^{rd}$-order and $5^{th}$-order harmonics may be rejected.

3. CONCLUSION

Exemplary embodiments have been described above. Those skilled in the art will understand, however, that changes and modifications may be made to the embodiments described without departing from the true scope and spirit of the present invention, which is defined by the claims.

We claim:

1. A harmonic-rejection power amplifier, comprising:
   a plurality of stages, each stage comprising a respective signal-generation component coupled to a respective power amplifier, wherein the respective signal-generation component is configured to output a respective signal having a respective phase, and wherein the respective power amplifier is configured to output an amplified version of the respective signal,
   wherein each respective phase differs from each other respective phase by a respective amount that is predefined based on a number of stages in the plurality of stages,
   wherein the plurality of stages are coupled in parallel to a combiner configured to (a) combine the output of each respective power amplifier into a combined output and (b) weight at least one output by a factor of $\sqrt{2}$ before combining the output of each respective power amplifier into the combined output.

2. The harmonic-rejection power amplifier of claim 1, wherein each respective signal-generation component is a mixer.

3. The harmonic-rejection power amplifier of claim 1, wherein a respective signal-generation component being configured to output a respective signal having a respective phase comprises the respective signal-generation component being configured to mix a respective baseband signal with a respective transmit signal having the respective phase to produce the respective signal.

4. The harmonic-rejection power amplifier of claim 3, wherein each respective baseband signal is substantially similar.

5. The harmonic-rejection power amplifier of claim 3, wherein each respective baseband signal is generated by the same entity.

6. The harmonic-rejection power amplifier of claim 3, wherein each respective transmit signal is a square wave signal.

7. The harmonic-rejection power amplifier of claim 3, wherein each respective transmit signal is generated at a respective local oscillator.

8. The harmonic-rejection power amplifier of claim 3, wherein the respective transmit signals are generated at a quadrature generation circuit.

9. The harmonic-rejection power amplifier of claim 1, wherein the combiner comprises a plurality of transformers.

10. The harmonic-rejection power amplifier of claim 1, wherein the combiner is further configured to weight at least one output by a predefined factor other than $\sqrt{2}$ before combining the output of each respective power amplifier into the combined output.

11. The harmonic-rejection power amplifier of claim 10, wherein the predefined factor is predefined based on the number of stages.

12. The harmonic-rejection power amplifier of claim 1, wherein at least one harmonic in the combined output is at least partially rejected.

13. A harmonic-rejection power amplifier, comprising:
a first stage comprising a first signal-generation component coupled to a first power amplifier, wherein the first signal-generation component is configured to output a first signal having a first phase and wherein the first power amplifier is configured to output an amplified version of the first signal;
a second stage comprising a second signal-generation component coupled to a second power amplifier, wherein the second signal-generation component is configured to output a second signal having a second phase and wherein the second power amplifier is configured to output an amplified version of the second signal; and
a third stage comprising a third signal-generation component coupled to a third power amplifier, wherein the third signal-generation component is configured to output a third signal having a third phase, and wherein the third power amplifier is configured to output an amplified version of the third signal,
wherein the first phase differs from the second phase by an amount of 90° and differs from the third phase by an amount of 180°, and
wherein the first stage, the second stage, and the third stage are coupled in parallel to a combiner configured to (a) combine the outputs of the first, second, and third power amplifiers into a combined output and (b) weight the output of the second output by a factor of $\sqrt{2}$ before combining the output of the first, second, and third power amplifiers into the combined output.

14. The harmonic-rejection power amplifier of claim 13, wherein each of the first signal-generation component, the second signal-generation component, and the third signal-generation component is a mixer.

15. The harmonic-rejection power amplifier of claim 13, wherein the combined output is a quantized sine wave.

16. The harmonic-rejection power amplifier of claim 13, wherein the combiner is further configured to weight at least one of the output of the first amplifier and the output of the third amplifier by a predefined factor other than $\sqrt{2}$ before combining the output of each respective power amplifier into the combined output.

17. The harmonic-rejection power amplifier of claim 13, wherein at least one harmonic in the combined output is at least partially rejected.

18. A method, comprising:
a plurality of stages respectively generating a plurality of outputs, wherein each output comprises an amplified version of a respective signal having a respective phase, and wherein each respective phase differs from each other respective phase by a respective amount that is predefined based on a number of stages in the plurality of stages, and combining the plurality of outputs into a combined output, wherein at least one output is weighted by a factor of $\sqrt{2}$ before combining the plurality of outputs.

19. The method of claim 18, wherein the combined output comprises a quantized sine wave.

20. The method of claim 18, wherein at least one harmonic in the combined output is at least partially rejected.

\* \* \* \* \*